US012454070B2

(12) United States Patent
Neyer et al.

(10) Patent No.: US 12,454,070 B2
(45) Date of Patent: Oct. 28, 2025

(54) HAIR REMOVAL DEVICE

(71) Applicant: Braun GmbH, Kronberg (DE)

(72) Inventors: Christian Neyer, Eschborn (DE); Martin Fuellgrabe, Bad Camberg (DE); Johannes Weinkauff, Frankfurt am Main (DE); Marvin Thorsten Knorr, Hochheim am Main (DE)

(73) Assignee: Braun GMBH, Kronberg (DE)

( * ) Notice: Subject to any disclaimer, the term of this patent is extended or adjusted under 35 U.S.C. 154(b) by 329 days.

(21) Appl. No.: 17/875,477

(22) Filed: Jul. 28, 2022

(65) Prior Publication Data

US 2023/0034605 A1 Feb. 2, 2023

(51) Int. Cl.

*B26B 19/38* (2006.01)
*A45D 26/00* (2006.01)
*G01R 25/00* (2006.01)

(52) U.S. Cl.

CPC ........ *B26B 19/388* (2013.01); *A45D 26/0042* (2013.01); *G01R 25/00* (2013.01)

(58) Field of Classification Search

CPC .... B26B 19/388; A45D 26/0042; G01B 25/00
See application file for complete search history.

(56) References Cited

U.S. PATENT DOCUMENTS

| | | | | |
|---|---|---|---|---|
| 2017/0113360 | A1* | 4/2017 | Godlieb | B26B 19/388 |
| 2018/0236674 | A1* | 8/2018 | Voorhorst | B26B 19/141 |
| 2019/0015998 | A1 | 1/2019 | Neyer et al. | |
| 2019/0224869 | A1* | 7/2019 | Robinson | B26B 21/227 |
| 2019/0299435 | A1 | 10/2019 | Fuellgrabe et al. | |
| 2021/0086379 | A1* | 3/2021 | Brette | B26B 21/4056 |

FOREIGN PATENT DOCUMENTS

| | | | |
|---|---|---|---|
| EP | 2875918 | A1 | 5/2015 |
| EP | 3427910 | A1 | 1/2019 |
| EP | 3546150 | A1 | 10/2019 |
| JP | H07313750 | A | 12/1995 |
| WO | 2016055509 | A1 | 4/2016 |

OTHER PUBLICATIONS

EP Search Report and Written Opinion for 21188508.2 dated Feb. 3, 2022, 5 pages.

* cited by examiner

*Primary Examiner* — Omar Flores Sanchez
(74) *Attorney, Agent, or Firm* — Gerd Zetterer

(57) ABSTRACT

The present invention relates to a hair removal device, such as an electric shaver or epilator, comprising a hair cutting unit, a motor for driving the hair cutting unit, a measurement unit for measuring motor current and/or induced voltage and a cutting activity determinator for determining cutting activity from the half cycles of the signal of said measurement unit, wherein a wear determination unit is provided for determining wear of the hair cutting unit from the cutting activity signal of said cutting activity determinator.

6 Claims, 3 Drawing Sheets

HAIR REMOVAL DEVICE

FIELD OF THE INVENTION

The present invention relates to a hair removal device such as an electric shaver or an epilator, comprising a hair cutting unit, a motor for driving the hair cutting unit, a measurement unit for measuring motor current and/or induced voltage, and a cutting activity determinator for determining cutting activity from the signal of said measurement unit.

BACKGROUND OF THE INVENTION

Motor driven hair cutting units of hair removal devices may include perforated shear foils and cutter blocks cooperating therewith, wherein the cutter blocks may linearly or rotatory reciprocate or continuously rotate under said shear foils to cut hairs entering the perforations of the shear foil. Other cutter types such as trimmers may include comb-like cutter bars or discs wherein hairs are cut between cutting fingers sliding over each other. Epilators may include cutting tools for tearing out hair what can be considered as a cutting action in the context of the present application.

When a cutting event occurs, i.e. when a cutting edge of the cutter block hits against a hair trapped in a perforation or a hair is clamped by an epilating tool, movement of the motor is usually slowed down to some extent what, in turn, affects the motor current and/or the level of the induced voltage. Basically, such slowdown of the motor movement may go along with a decrease of the level of the induced voltage.

More particularly, timing properties of the induced voltage change due to cutting activity. For rotating motors, a delay as a consequence of such slowing down may be expected. On the other hand, for linear motors running in a mechanical resonance, a delay as well as the opposite may be possible.

Such timing property of the induced voltage may include the so-called half cycle duration, i.e. the distance in time between the zero crossing of the induced voltage from negative to positive values and/or the next zero crossing from positive to negative values. The induced voltage usually oscillates about a basic line defining said zero crossings. The signal measured by the measurement unit monitoring motor current and/or induced voltage usually shows a cyclic or periodic pattern similar to—roughly speaking—a sinus wave. The shape of such periodic pattern is affected by the cutting events so analyzing the timing property and/or the time pattern of such signal allows to determine cutting activity.

For example, document EP 34 27 910 B1 suggests to determine the aforementioned half cycle of the voltage signal of a motor driven hair cutting unit to determine the cutting activity on the basis of fluctuations in the determined half cycles, wherein the determined cutting activity is subtracted or more generally, set into relation to driving resistance determined from motor current so as to determine the force with which the shaver head is pressed onto the skin to give the user a feedback signal when skin contact pressure is exceeding a reasonable range. Pressure onto the skin is deemed to cause a more uniform driving resistance so filtering out the oscillations coming from cutting events should lead to the true driving resistance caused by skin pressure what in turn allows determination of unreasonable skin pressure.

On the other hand, document WO 2016/055509 A1 suggests to use the measured value of motor current for the determination of wear and tear of the cutter head. More particularly, said documents suggests to give the cutting tools a specific structure and design to significantly change friction of the cutting tools when wear and tear occurs, wherein changes in friction of the cutting tools can be evaluated on the basis of the motor current. To avoid the complex effects of cutting activity on friction, it is suggested to determine motor current immediately after start of the shaver to determine the wear-based friction change during idling of the shaver.

So as to indicate replacement of the shaver head is necessary or reasonable, it also has been suggested to count the number of shaves or to measure overall operation time, going on the assumption that a certain number of shaves and/or a certain overall operation time would result in a certain degree of wear and tear necessitating replacement of the shaver head. After replacement of the shaver head, the counter is reset to once again start counting the number of shaves or measuring overall operation time for the new shaver head.

SUMMARY OF THE INVENTION

It is an objective underlying the present invention to provide for an improved personal care device avoiding at least one of the disadvantages of the prior art and/or further developing the existing solutions. A more particular objective underlying the invention is to provide for an improved determination of the sharpness of the hair cutting unit and wear and tear thereof.

Another objective underlying the invention is to achieve reliable and precise determination of the hair cutting units sharpness and wear and tear without necessitating complex modification of the cutting parts for relating friction and driving resistance to wear and tear, and without necessitating a manual reset when replacing the shaver head.

A still further objective underlying the invention is to allow for reliable determination of wear and tear without necessitating specific sensor units or other additional parts specifically needed for wear and tear determination.

To achieve at least one of the aforementioned objectives, it is suggested to further analyze cutting activity of the motor driven hair cutting unit and to determine wear of the hair cutting unit from the cutting activity signal representing cutting activity. More particularly, a wear determining unit is configured to determine wear of the hair cutting unit from the cutting activity signal issued by the cutting activity determinator which determines the cutting activity from the signal of the measurement unit measuring motor current and/or induced voltage. Said cutting activity signal which is affected by cutting events of hair being cut by the hair cutting unit, shows timing characteristics that change due to wear and tear of the cutting unit so analyzing the cutting activity signal allows for reliable determination whether the hair cutting unit is sharp or dull or more generally, the state of wear and tear of the hair cutting unit.

Determination of the wear of the hair cutting unit on the basis of analyzing the cutting activity signal renders resetting the hair removal device after replacement of the hair cutting unit and any switch for this purpose can be omitted. Thus, operation of the device becomes simpler.

Furthermore, no complex modification of cutting parts to achieve significant changes in friction due to tear and wear are necessary. Specific additional sensor equipment may be avoided since the measurement unit for measuring motor current and/or induced voltage is usually present and used for controlling motor operation.

More particularly, the cutting activity signal may be indicative of and/or derived from the half cycle duration of the induced voltage signal provided by the measurement unit and/or fluctuations of said half cycle duration.

To determine wear and tear from such cutting activity signal, at least one of the following characteristics of the cutting activity signal may be determined:

The maximum value of the cutting activity may be determined and compared to a threshold, wherein the maximum value may be determined during a plurality of hair removal sessions and/or during multiple predetermined time intervals, and the number of times such a threshold is exceeded may be determined to improve the robustness of the determination against single errors.

In addition or in the alternative, peak values of the oscillating cutting activity signal may be determined and compared to a threshold, wherein the number of times the peak threshold is exceeded per shave or per defined time interval may be determined.

In addition or in the alternative, the area below the cutting activity signal may be determined, wherein for example the cutting signal activity signal may be integrated over a shave or hair removal session, wherein the determined area and/or the determined integral may be compared with a threshold.

The wear determining unit may issue a wear signal when at least one of the aforementioned characteristics have been determined, i.e. the maximum value has exceeded the threshold and/or the maximum threshold has been exceeded for a predetermined number of times and/or the signal peaks of the cutting activity signal have exceeded the threshold a predetermined number of times during a hair removal treatment and/or per defined time interval and/or the area/integral of the cutting activity signal has exceeded a predefined threshold.

Advantageously, the aforementioned integral of the cutting activity signal for one hair removal treatment can be compared to the integral of the cutting activity signal that was measured in a prior initialization operation and/or prior initialization shave and/or prior initialization treatment, what may be the first hair removal treatment with the respective cutting part or a factory measured cutting activity signal. When the determined integral of the cutting activity signal for a treatment has changed to a certain extent in comparison to the benchmark integral, the hair cutting unit may be considered as dull and blunt, respectively.

In addition or in the alternative, a trendline may be determined from any one or more of the aforementioned characteristics, wherein a wear signal may be given, when the trendline reaches or exceeds a certain threshold or shows a rate of increase reaching or exceeding a threshold rate of increase.

DETAILED DESCRIPTION OF THE INVENTION

Figure 1:
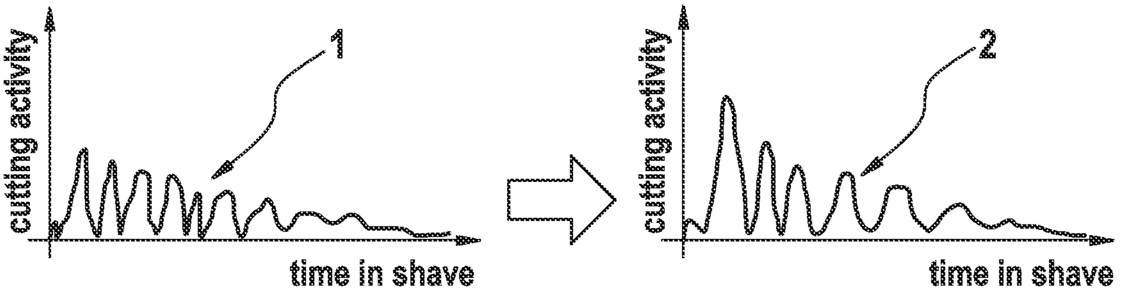
FIG. 1: a functional diagram of the cutting activity signal over time, wherein partial view a shows the cutting activity signal of a sharp/new hair cutting unit and partial view b shows the cutting activity signal of a blunt hair cutting unit.

As becomes apparent from the figures, it is suggested to provide further analysis of cutting activity of the motor driven hair cutting unit to determine wear of the hair cutting unit from the cutting activity signal representing cutting activity. More particularly, a wear determining unit is configured to determine wear of the hair cutting unit from the cutting activity signal issued by the cutting activity determinator which determines the cutting activity from the signal of the measurement unit measuring motor current and/or induced voltage. Said cutting activity signal which is affected by cutting events of hair being cut by the hair cutting unit, shows timing characteristics that change due to wear and tear of the cutting unit so analyzing the cutting activity signal allows for reliable determination whether the hair cutting unit is sharp or dull or more generally, the state of wear and tear of the hair cutting unit.

Determination of the wear of the hair cutting unit on the basis of analyzing the cutting activity signal renders resetting the hair removal device after replacement of the hair cutting unit mute, and any switch for this purpose can be omitted. So operation of the device becomes simpler.

Furthermore, no complex modification of cutting parts to achieve significant changes in friction due to tear and wear are necessary.

More particularly, the cutting activity signal may be indicative of the half cycle duration of the induced voltage signal provided by the measurement unit and fluctuations of said half cycle duration.

To determine wear and tear from such cutting activity signal, at least one of the following characteristics of the cutting activity signal may be determined:

The maximum value of the cutting activity may be determined and compared to a threshold, wherein the number of times such a threshold is exceeded may be determined to improve the robustness of the determination against single errors.

The wear determination unit comprises a data storage unit for storing first data of the cutting activity signal during hair removal treatments and a data comparator which compares earlier first data with more recent first data to issue a wear signal if a threshold is reached or exceeded.

In addition or in the alternative, peak values of the cutting activity signal may be determined and compared to a threshold, wherein the number of times the peak threshold is exceeded per shave or per defined time interval may be determined.

In addition or in the alternative, the area below the cutting activity signal may be determined, wherein for example the cutting signal activity signal may be integrated over a shave or hair removal treatment, wherein the determined area and/or the determined integral may be compared with a threshold.

The wear determining unit may issue a wear signal when at least one of the aforementioned characteristics have been determined, i.e. the maximum value has exceeded the threshold and/or the maximum threshold has been exceeded for a predetermined number of times and/or the signal peaks of the cutting activity signal have exceeded the threshold a predetermined number of times during a hair removal treatment and/or per defined time interval and/or the area/integral of the cutting activity signal has exceeded a predefined threshold.

Advantageously, the aforementioned integral of the cutting activity signal for one hair removal treatment can be compared to the integral of the cutting activity signal that was measured in a prior initialization operation and/or prior initialization shave and/or prior initialization treatment, what may be the first hair removal treatment with the respective cutting part or a factory measured cutting activity signal. When the determined integral of the cutting activity signal for a treatment has changed to a certain extent in comparison to the benchmark integral, the hair cutting unit may be considered as dull and blunt, respectively.

So as to achieve an early determination of wear or a sort of forecast of wear, a trend and/or a trend line may be determined from one or more of the aforementioned characteristics. For example, a trend of the determined maximum values of the cutting activity signal of a plurality of hair removal treatments may be determined, and/or a trend line may be determined from the number of signal peaks exceeding the peak threshold. In addition or in the alternative, also a trend line may be determined for the values of the area below the cutting activity signal and/or of the integrals determined from the cutting activity signal during a plurality of hair removal treatments and/or a plurality of predetermined time units. The trend of the integral and/or of the area below the curve is an early indication of wear and tear.

For example, as soon as the trend line determined from anyone of the aforementioned characteristics reaches or exceeds a threshold value and/or a predefined level of increase in comparison to previous measurements, wear of the hair cutting system may be forecast or determined.

In addition or in alternative to the aforementioned determination procedures, also the differences between changes in overall power consumption and cutting signal of one point in time or of an average may be deliver further information on the usage conditions to derive hints regarding maintenance parameters like cleaning and/or lubricating of cutting parts independently of the sharpness of the blades. For example, when the integral of the cutting activity signal of one or more shaves turns out to be significantly lower than the integral of a previous shave or an average of integrals of previous shaves, it may be assumed and determined that a cleaning and/or lubricating step has been performed. The control unit also may issue such maintenance signals indicating improvements such as cleaning and/or lubricating.

Figure 2:
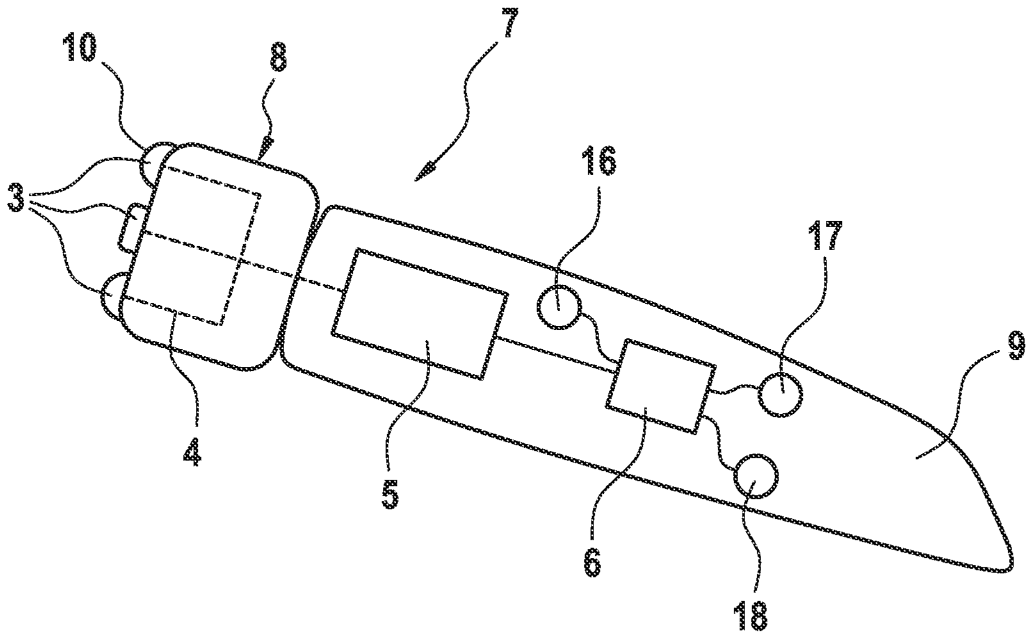
FIG. 2: a side view of a hair removal device in terms of an electric shaver having a motor driven hair cutting unit.

As can be seen from FIG. 2, the hair removal device 7 may include an elongate handle 9 to be gripped by the fingers or the hand of a user, wherein a working head 8 is attached to said handle 9 to be moved along a body surface.

Said working head 8 includes one or more hair cutting units 3 which may include, for example, a perforated shear foil 10 cooperating with an undercutter or cutter block 13 which may linearly or rotatorily reciprocate or continuously rotate under said shear foil 10.

Said hair cutting units 3 are motor-driven by means of a motor 5 connected to the hair cutting units 3 by means of a transmitter or drive train 4, cf. FIG. 2, wherein, for example, said motor 5 may be an electric motor having an output motor shaft, the rotation of which is transmitted to the undercutter/cutter block 13 by means of said drive train 4, wherein the rotatory motor movement may be transformed into a reciprocating movement of said undercutters. Alternatively a linear motor type may be employed as motor 5 which already generates an oscillating back and forth drive movement which is transmitted to undercutter/cutter block 13 by means of an adapted drive train.

The motor 5 may be controlled by means of an electronic control unit 6 which may include a microprocessor and a storage for storing an operation program and/or data, wherein the control unit 6 may include power electronic elements to control operation of the motor 5.

Figure 3:
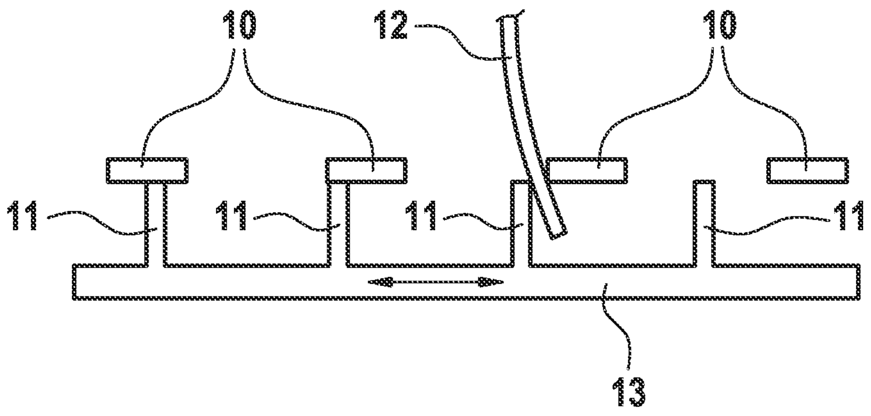
FIG. 3: a cross-sectional view of the hair cutting unit of the hair removal device of FIG. 2, said hair cutting unit including a perforated shear foil and a reciprocating cutter block cooperating therewith, wherein a hair trapped in one of the perforations immediately before cutting is shown.
Figure 4:
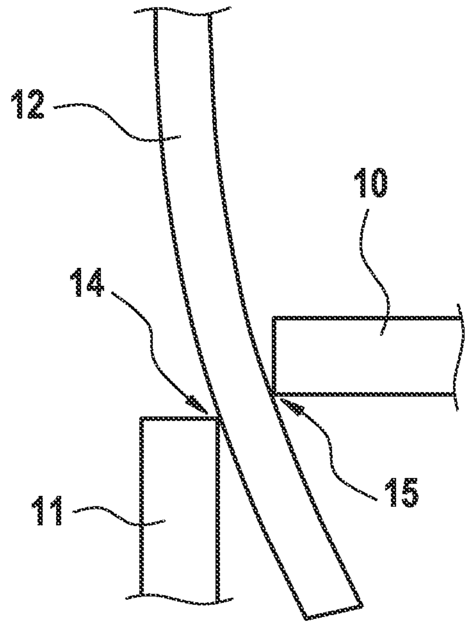
FIG. 4: an enlarged view the hair in the hair cutting unit of FIG. 3 immediately before a cutting event.

As can be seen by FIGS. 3 and 4, a hair 12 may enter into the hair cutting unit 3 and extend through one of the perforations of the shear foil 10 so that the hair 12 gets trapped between the foil edge 15 of a perforation of the shear foil 10 and the blade edge 14 of one of the blades 11 of the cutter block 13. When the blade 11 is further moving to the right, the hair 12 is cut. Such cutting event increases the moving resistance of the cutter block 13 and affects the mechanical movement of the motor 5 what, in turn, affects the motor current and induced voltage which are monitored by a measurement unit 16 which may be part of and/or attached to the electronic control unit 6.

A cutting activity determinator 17 may analyze the motor current and/or induced voltage signals of said measurement unit 16, wherein said cutting activity determinator 17 also may be part of and/or attach to the electronic control unit 6, for example, it may be a software application stored in the storage of the electronic control unit 6.

More particularly, the cutting activity determinator 17 may analyze the time characteristics of the induced voltage signal and/or the motor current signal to determine the half-cycles of the oscillating voltage and/or current signal. Said half-cycle is the distance in time between the zero-crossing of the voltage signal from negative to positive values and/or the next zero crossing from positive to negative values, wherein such time characteristic may be evaluated by testing the induced voltage signal with a comparator, or in other suitable ways. With regard to the determination of the half-cycle duration of the induced voltage signal provided by the measuring unit 16, reference may be given to EP 3 427 910 B1.

The aforementioned timing characteristics of the signal of the measurement unit 16 in terms of the half-cycle duration and fluctuations thereof is an indication of cutting activity and is affected by hair cutting parameters such as the member of single hairs 12 cut per unit of time, the hair thickness and the force that is needed by the blade edge 14 and the shear foil edge 15 to cut a hair 12. Said cutting parameters affect the energy that a cutting event absorbs and takes out of the movement of the motor 5. The force that is needed to cut a hair inter alia depends on the sharpness of the cutting edges 14 and 15 of the cutting elements, wherein, generally, a bluntcutting element will need more force comparable to an old knife or an old pair of scissors that need more force to cut a piece of material in comparison to new ones. Therefore, the measured cutting activity will increase over time when the cutting parts become more dull or more blunt. Cutting activity may be understood as the effort of the hair cutting unit 3 for performing the cutting events as described before.

The effects of blunt cutting edges and sharp cutting edges can be seen from FIG. 1 where partial view a) shows the cutting activity signal 1 over time for a sharp hair cutting system and where partial view b) shows the cutting activity signal 2 over time for a blunt/dull hair cutting system 3. Said cutting activity signal may be derived from the aforementioned half-cycle duration of the signal provided by measurement unit 16 and may be indicative of the fluctuations of the half-cycle duration.

As can be seen from FIG. 1, the cutting activity signal 2 has generally a higher level when the hair cutting unit 3 is dull or shows wear and tear, cf. partial view b) of FIG. 1 in comparison to partial view a) thereof. When the cutting edges 14 and 15 are sharp and/or new, the movement of the motor 5 is less slowed down and energy consumption is less in comparison to a hair cutting system 3 that shows wear and tear and/or has blunt cutting edges.

A wear determination unit 18 which may be part of and/or connected to the electronic control unit 16 and may include a software application, may analyze the characteristics of the cutting activity signal 1, 2 shown in FIG. 1 to determine wear of the cutting unit 3.

More particularly, the wear determination unit 18 may determine the maximum value of the cutting activity signal 1, 2 and may compare the determined maximum value to a threshold. If the determined maximum value reaches or exceeds such threshold, the wear determination unit 18 may issue a wear signal.

In addition or in the alternative, the number of times such threshold is exceeded by the determined maximum values can be counted and as soon as a threshold or counter value is reached or exceeded, the hair cutting unit 3 may be considered as blunt and/or a wear signal may be issued by the wear determination unit 18. Taking into account a plurality of determined maximum values may improve the robustness of the method against single errors.

In addition or in the alternative to determining a maximum value, the peak values of the oscillating signal may be determined and may be compared to a peak threshold, wherein the number of times the determined peaks reach or exceed the peak threshold per one hair removal treatment or per defined time interval may be counted. When the number of times the peak threshold is exceeded per shave/hair removal treatment or per defined time interval reaches a certain counter value or threshold, a blunt hair cutting unit 3 may be assumed and the wear determination unit 18 may issue a wear signal.

Figure 5:
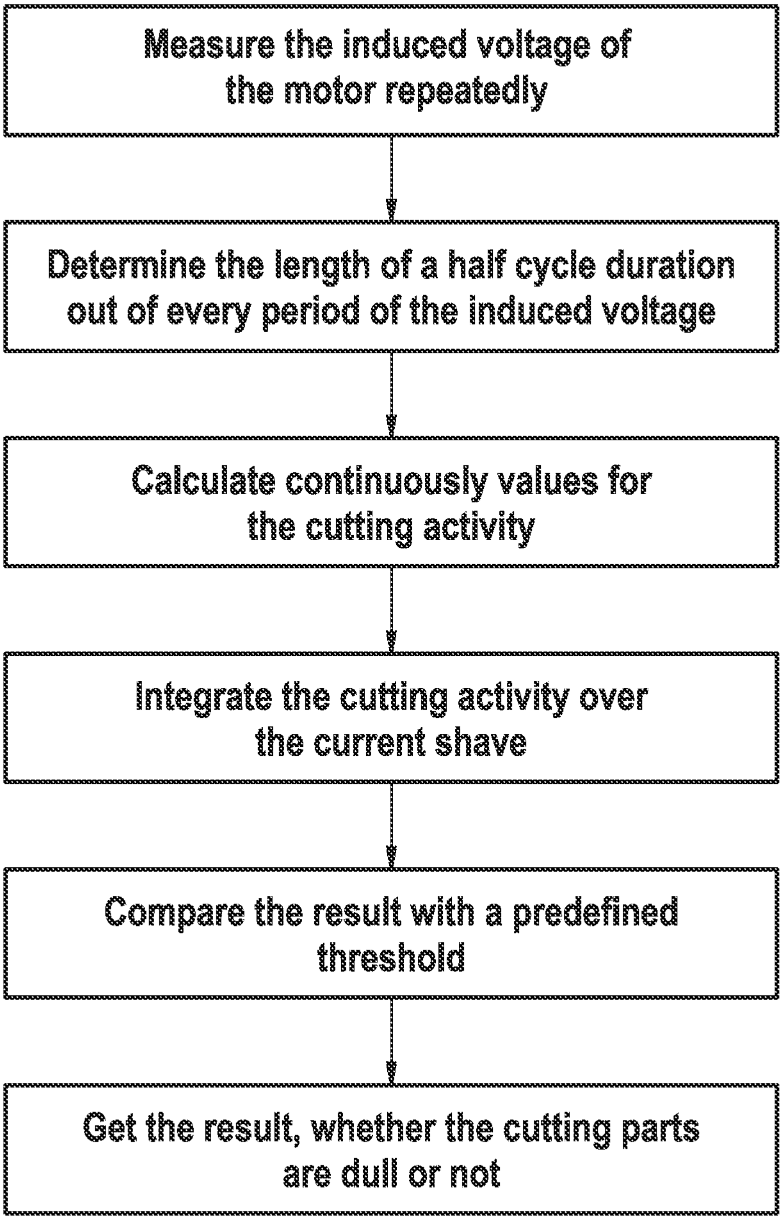
FIG. 5: a flow chart of the operational steps for determining wear and tear of the motor driven hair cutting unit of the hair removal device of the preceding figures.

As can be seen from FIG. 5, the wear determination unit 18 may determine the area below the cutting activity signal 1, 2, i.e. the area between said cutting activity signal and a base line such as the time axis of the functional diagrams of FIG. 1. In order to determine the area below the cutting activity signal, said cutting activity signal may be integrated, for example over a whole hair removal treatment and/or over a whole shave, wherein the determined integral may be compared with a previously defined threshold, c.f. FIG. 5. When the predefined threshold is exceeded by the determined area and the determined integral, respectively, the wear determination unit 18 may issue a wear signal.

For example, the determined area below the cutting activity signal and/or the calculated integral of the cutting activity signal for one shave/one hair removal treatment may be compared to the integral of the cutting activity signal (or the area below said cutting activity signal) that was measured in a prior initialization or benchmark shave/hair removal treatment or in a previous shave, for example in a first hair removal treatment with the hair cutting unit 3 or a manufacturing factory measured cutting activity signal. When the calculated integral and/or the area determined below the cutting activity signal has changed to a predefined extent in comparison to the benchmark hair removal treatment, the hair cutting unit 3 may be considered as blunt and a wear signal may be issued.

The aforementioned area below the cutting activity signal also may be determined by other methods such as fitting columns of predetermined widths under the signal curve or other approximation calculations.

So as to achieve an early determination of wear or a sort of forecast of wear, a trend and/or a trend line may be determined from one or more of the aforementioned characteristics. For example, a trend of the determined maximum values of the cutting activity signal of a plurality of hair removal treatments may be determined, and/or a trend line may be determined from the number of signal peaks exceeding the peak threshold. In addition or in the alternative, also a trend line may be determined for the values of the area below the cutting activity signal and/or of the integrals determined from the cutting activity signal during a plurality of hair removal treatments and/or a plurality of predetermined time units. The trend of the integral and/or of the area below the curve is an early indication of wear and tear.

For example, as soon as the trend line determined from anyone of the aforementioned characteristics reaches or exceeds a threshold value and/or a predefined level of increase in comparison to previous measurements, wear of the hair cutting system may be forecast or determined.

In addition or in alternative to the aforementioned determination procedures, also the differences between changes in overall power consumption and cutting signal of one point in time or of an average may deliver further information on the usage conditions to derive hints regarding maintenance parameters like cleaning and/or lubricating of cutting parts independently of the sharpness of the blades. For example, when the integral of the cutting activity signal of one or more shaves turns out to be significantly lower than the integral of a previous shave or an average of integrals of previous shaves, it may be assumed and determined that a cleaning and/or lubricating step has been performed. The control unit also may issue such maintenance signals indicating improvements such as cleaning and/or lubricating.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as “40 mm” is intended to mean “about 40 mm.”

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

The invention claimed is:

1. A hair removal device comprising an electric shaver or epilator, comprising a hair cutting unit, a motor for driving the hair cutting unit, a current and/or voltage measurement unit to measure motor current and/or induced voltage and an electronic control unit comprising a microprocessor and storage for storing software applications such that the electronic control unit is configured to define a cutting activity determinator to determine cutting activity during hair cutting from a signal of said measurement unit, and the electronic control unit further defines a wear determination unit to determine wear of the hair cutting unit from a cutting activity signal of said cutting activity determinator, wherein areas below the cutting activity signals of a plurality of hair removal treatments are determined, wherein a trend line indicative of a trend of said determined areas is determined and compared to a trend line threshold and/or a trend line threshold increase, and a wear signal is issued when said trend line reaches or exceeds the trend line threshold and/or a trend line increase reaches or exceeds the trend line increase threshold.

2. A hair removal device comprising an electric shaver or epilator, comprising a hair cutting unit, a motor for driving the hair cutting unit, a current and/or voltage measurement unit to measure motor current and/or induced voltage and an electronic control unit comprising a microprocessor and storage for storing software applications such that the electronic control unit is configured to define a cutting activity determinator to determine cutting activity from a signal of said measurement unit, and the electronic control unit further defines a wear determination unit to determine wear of the hair cutting unit from a cutting activity signal of said cutting activity determinator, wherein the electronic control unit defining said wear determination unit is configured to determine an area below the cutting activity signal of at least one hair removal treatment and to compare the determined area to a threshold, and to issue a wear signal when said threshold is reached or exceeded by the determined area.

3. A hair removal device according to claim 2, wherein the electronic control unit defining said wear determination unit includes an integrator to calculate said area below the cutting activity signal by integration thereof.

4. A hair removal device comprising an electric shaver or epilator, comprising a hair cutting unit, a motor for driving the hair cutting unit, a current and/or voltage measurement unit to measure motor current and/or induced voltage and an electronic control unit comprising a microprocessor and storage for storing software applications such that the electronic control unit is configured to define a cutting activity determinator to determine cutting activity during hair cutting from a signal of said measurement unit, and the electronic control unit further defines a wear determination unit to determine wear of the hair cutting unit from a cutting activity signal of said cutting activity determinator, wherein the electronic control unit defining the wear determination unit is configured to determine maximum values of the cutting activity signal of a plurality of hair removal sessions, and a trend line indicative of a trend of said maximum values, and to compare said trend line to a trend line threshold and/or a trend line increase threshold, and to issue a wear signal when said trend line reaches or exceeds the trend line threshold and/or a trend line increase reaches or exceeds the trend line increase threshold.

5. A hair removal device comprising an electric shaver or epilator, comprising a hair cutting unit, a motor for driving the hair cutting unit, a current and/or voltage measurement unit to measure motor current and/or induced voltage and an electronic control unit comprising a microprocessor and storage for storing software applications such that the electronic control unit is configured to define a cutting activity determinator to determine cutting activity during hair cutting from a signal of said measurement unit, and the electronic control unit further defines a wear determination unit to determine wear of the hair cutting unit from a cutting activity signal of said cutting activity determinator, wherein the electronic control unit defining said wear determination unit is configured to determine peak values of the cutting activity signal of a plurality of hair removal sessions, and a trend line indicative of a trend of said determined areas, and to compare such trend line to a trend line threshold and/or a trend line increase threshold, and to issue a wear signal when said trend line reaches or exceeds the trend line threshold and/or a trend line increase reaches or exceeds the trend line increase threshold.

6. A hair removal device comprising an electric shaver or epilator, comprising a hair cutting unit, a motor for driving the hair cutting unit, a current and/or voltage measurement unit to measure motor current and/or induced voltage and an electronic control unit comprising a microprocessor and storage for storing software applications such that the electronic control unit is configured to define a cutting activity determinator to determine cutting activity from a signal of said measurement unit, and the electronic control unit further defines a wear determination unit to determine wear of the hair cutting unit from a cutting activity signal of said cutting activity determinator, wherein the cutting activity determinator is configured to determine the cutting activity signal from a half cycle duration of the signal of the measurement unit so the cutting activity signal is indicative of fluctuations of the half cycle duration of said signal of the measurement unit.

* * * * *